US009171768B2

(12) United States Patent
Takamiya et al.

(10) Patent No.: US 9,171,768 B2
(45) Date of Patent: Oct. 27, 2015

(54) SEMICONDUCTOR DEVICE

(75) Inventors: Yoshikazu Takamiya, Matsumoto (JP); Yoshihiro Kodaira, Matsumoto (JP); Kazunaga Onishi, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/239,042

(22) PCT Filed: Sep. 3, 2012

(86) PCT No.: PCT/JP2012/072396
§ 371 (c)(1),
(2), (4) Date: Mar. 4, 2014

(87) PCT Pub. No.: WO2013/047101
PCT Pub. Date: Apr. 4, 2013

(65) Prior Publication Data
US 2014/0210067 A1    Jul. 31, 2014

(30) Foreign Application Priority Data
Sep. 28, 2011    (JP) .................................. 2011-213574

(51) Int. Cl.
*H01L 23/04*    (2006.01)
*H01L 23/055*    (2006.01)
(Continued)

(52) U.S. Cl.
CPC .............. *H01L 23/055* (2013.01); *H01L 21/52* (2013.01); *H01L 23/049* (2013.01); *H01L 23/49811* (2013.01); *H01L 23/3735* (2013.01); *H01L 24/29* (2013.01); *H01L 24/32* (2013.01);
(Continued)

(58) Field of Classification Search
CPC .............................. H01L 23/055; H01L 21/52
USPC ........................................................... 257/698
See application file for complete search history.

(56) References Cited

U.S. PATENT DOCUMENTS 5,155,660 A * 10/1992 Yamada et al. ................ 361/717
8,277,100 B2 * 10/2012 Tokunaga ..................... 362/547
(Continued)

FOREIGN PATENT DOCUMENTS

EP    0513410 A1    11/1992
JP    H04-111346 A    4/1992
(Continued)

OTHER PUBLICATIONS

PCT, "International Search Report for International Application No. PCT/JP2012/072396".
(Continued)

*Primary Examiner* — Luan C Thai
(74) *Attorney, Agent, or Firm* — Manabu Kanesaka

(57) ABSTRACT

A semiconductor device includes an insulating substrate joined with a semiconductor chip, a case covering a surface of the insulating substrate where the semiconductor chip is joined, and a control terminal in which one end portion is electrically connected to the semiconductor chip, and another end portion passes through the case and is exposed to outside of the case. A portion of the control terminal exposed to the outside of the case includes a cut-out section where a part of the exposed portion is cut out, and a blocking section formed by bending a portion surrounded by the cut-out section and remaining on the control terminal. The blocking section contacts the case from the outside of the case and blocks a movement of the control terminal.

4 Claims, 15 Drawing Sheets

(51) Int. Cl.
  *H01L 23/498* (2006.01)
  *H01L 23/049* (2006.01)
  *H01L 21/52* (2006.01)
  *H01L 23/00* (2006.01)
  *H01L 23/373* (2006.01)
  *H01L 25/07* (2006.01)

(52) U.S. Cl.
  CPC ............... *H01L 24/45* (2013.01); *H01L 24/49* (2013.01); *H01L 24/73* (2013.01); *H01L 25/072* (2013.01); *H01L 2224/29101* (2013.01); *H01L 2224/32225* (2013.01); *H01L 2224/45124* (2013.01); *H01L 2224/48091* (2013.01); *H01L 2224/48137* (2013.01); *H01L 2224/48227* (2013.01); *H01L 2224/4911* (2013.01); *H01L 2224/73265* (2013.01); *H01L 2924/1305* (2013.01); *H01L 2924/13055* (2013.01); *H01L 2924/19107* (2013.01)

(56) References Cited

U.S. PATENT DOCUMENTS

| 2008/0217756 A1* | 9/2008 | Boettcher et al. ............. 257/691 |
| 2013/0250535 A1 | 9/2013 | Takamiya et al. |

FOREIGN PATENT DOCUMENTS

| JP | H05-15444 U | 2/1993 |
| JP | H07-19966 U | 4/1995 |
| JP | 07-153906 A | 6/1995 |
| JP | 08-162582 A | 6/1996 |
| JP | 10-065098 A | 3/1998 |
| WO | 2012/066833 A1 | 5/2012 |

OTHER PUBLICATIONS

Europe Patent Office, "Search Report for EP 12836375.1," Jan. 27, 2015.

* cited by examiner

SEMICONDUCTOR DEVICE

RELATED APPLICATIONS

The present application is National Phase of International Application No. PCT/JP2012/072396 filed Sep. 3, 2012, and claims priority from Japanese Application No. 2011-213574 filed Sep. 28, 2011.

TECHNICAL FIELD

The present invention relates to a semiconductor device.

BACKGROUND ART

A transition to a higher degree of integration of semiconductor chips in a modular semiconductor device in which a plurality of semiconductor chips, for example IGBT (Insulated Gate Bipolar Transistors), is accommodated in the same package has recently been advanced. In such a modular semiconductor device, the dimensional accuracy of external terminals joined to a wiring substrate inside the package is therefore required in addition to the joining strength and reliability of the external terminals.

FIG. 13 is a plan view illustrating schematically the conventional modular semiconductor device. FIG. 14 is a cross-sectional view taken along a line AA-AA' in FIG. 13. FIG. 15 is a cross-sectional view taken along a line BB-BB' in FIG. 13. As shown in FIGS. 13 to 15, the conventional semiconductor device 100 is provided with semiconductor chips 101, wiring substrates 102, aluminum wires 103, main terminals 104, a control terminal 105, a metal base 106, and a resin case 120. The resin case 120 is obtained by integrally molding a lid 121 and a side wall 122.

In the wiring substrate 102, circuit patterns 102a, 102b are formed on the surface of an insulating substrate. The rear surface of the semiconductor chip 101 is joined by a joining material (not shown in the figure) to the circuit pattern 102a of the wiring substrate 102. An electrode (not shown in the figures) provided on the front surface of the semiconductor chips 101 and the circuit pattern 102b of the wiring substrate 102 are electrically connected to each other by the aluminum wire 103. Further, one end of each of the main terminals 104 and one end of the control terminal 105, which are external terminals, are joined by a joining material 111 to the circuit pattern 102b of the wiring substrate 102.

A metal film 102c is provided on the rear surface of the wiring substrate 102, and this metal film 102c is joined by a joining material (not shown in the figure) to the metal base 106. The metal base 106 is produced from a material with good thermal conductivity and conducts the heat generated by the semiconductor chip 101 and transferred through the wiring substrate 102 to the outside of the semiconductor device 100. The resin case 120 is bonded to the circumferential edge of the metal base 106. The other end of each main terminal 104 and the other end of the control terminal 105 are exposed to the outside of the resin case 120 through the lid 121 of the resin case 120.

A through hole 121a through which the control terminal 105 passes is provided in the lid 121. The through hole 121a has a substantially rectangular planar shape having the dimensions corresponding to the width and thickness of the control terminal 105 molded, for example, from a single plate-shaped member. The width w101 of the through hole 121a in the longitudinal direction thereof has a dimension obtained by adding up a width w111 of a section (referred to hereinbelow as "through section") 105a of the control terminal 105 that passes through the lid 121 and a width w112 of a protruding section 105d of the below-described through section 105a. The side section of the through hole 121a in the longitudinal direction is parallel to the arrangement direction of the main terminals 104 fixed to the lid 121.

The side section of the through hole 121a in the lateral direction is provided with an L-shaped step 121b on the side of the surface (referred to hereinbelow as "front surface") of the lid 121 that is exposed to the outside of the resin case 120. A protrusion 121c that protrudes to the wiring substrate 102 side and is connected to the side section of the through hole 121a that faces the side section provided with the step 121b is provided on the surface (referred to hereinbelow as "rear surface") of the lid 121 that is exposed inside the resin case 120. The control terminal 105 contacts and is locked (fixed) to the step 121b and the protrusion 121c.

More specifically, the control terminal 105 is constituted by the through section 105a passing through the through hole 121a of the lid 121, a connection section 105c joined to the circuit pattern 102b of the wiring substrate 102, and a linking section 105b that links the through section 105a and the connection section 105c. The through section 105a, the linking section 105b, and the connection section 105c are constituted by plate-shaped members. The other end (referred to hereinbelow as "lower end portion") of the connection section 105c that is on the side opposite that of the end (referred to hereinbelow as "upper end portion") linked to the linking section 105b is joined by the joining material 111 to the circuit pattern 102b of the wiring substrate 102.

The flat surface of the connection section 105c is substantially perpendicular to the front surface of the wiring substrate 102. The linking section 105b is linked to the connection section 105c at the connection section 105c on the lid 121 side (upper end portion) and forms an L-shape together with the connection section 105c. The flat surface of the linking section 105b is at a substantially right angle to the flat surface of the connection section 105c and is substantially parallel to the front surface of the wiring substrate 102. Further, the linking section 105b is linked to the end portion (referred to hereinbelow as "lower end portion") of the through section 105a on the wiring substrate 102 side and forms an L-shape together with the through section 105a.

The flat surface of the linking section 105b is arranged at a substantially right angle to the flat surface of the through section 105a. The flat surface of the through section 105a is substantially perpendicular to the front surface of the wiring substrate 102. The end portion (referred to hereinbelow as "upper end portion") on the opposite side with respect to the lower end portion of the through section 105a is exposed to the outside of the resin case 120 from the through hole 121a provided in the lid 121. A protruding section 105d is provided on the side surface of the through section 105a facing the step 121b formed at the side section of the through hole 121a.

The protruding section 105d is provided with a shape such that is narrow on the upper end portion side of the through section 105a and expands toward the lower end portion side. The lower end portion of the protruding section 105d contacts the bottom surface of the step 121b. The protruding section 105d prevents the control terminal 105 from moving toward the wiring substrate 102. Further, the surface of the linking section 105b on the lid 121 side comes close to the protrusion 121c provided on the rear surface of the lid 121. The linking section 105b thus prevents the control terminal 105 from moving in the withdrawing direction from the wiring substrate 102.

A method for locking the control terminal 105 to the lid 121 will be explained below. FIGS. 16(a)-16(c) are explanatory drawings illustrating the principal part of the conventional semiconductor device in the assembling process. FIGS. 16(a) to 16(c) illustrate a control terminal vicinity 130 in the semiconductor device 100 shown in FIG. 14. FIG. 16(a) shows the control terminal 105 before it is inserted into the through hole 121a. FIG. 16(b) shows the control terminal 105 inserted in the through hole 121a. FIG. 16(c) shows the control terminal 105 locked to the lid 121.

In the semiconductor device 100 that is being manufactured, as shown in FIGS. 16(a) to 16(c), treatment is performed to bond the resin case 120 to the metal base (not shown in the figure). The lower end portion of the connection section 105c of the control terminal 105 is joined to the circuit pattern 102b of the wiring substrate 102 (this joint is not shown in FIGS. 16(a) to 16(c)). First, as shown in FIG. 16(a), the through section 105a of the control terminal 105 is inserted from the rear surface side of the lid 121 into the through hole 121a.

Then, as shown in FIG. 16(b), the through section 105a is further inserted into the through hole 121a so that a portion of the protruding section 105d of the through section 105a is exposed on the front surface side of the lid 121. Since the width w101 of the through hole 121a in the longitudinal direction has a dimension (w101=w111+w112) obtained by adding up the width w111 of the through section 105a and the width w112 of the protruding section 105d, the portion of the through section 105a where the protruding section 105d is provided also passes through the through hole 121a.

Then, the through section 105a is inserted into the through hole 121a till the surface of the linking section 105b linked to the lower end portion of the through section 105a, this surface being on the lid 121 side, contacts the protrusion 121c provided on the rear surface of the lid 121. When the surface of the linking section 105b on the lid 121 side contacts the protrusion 121c, the upper end portion of the through section 105a is exposed to the outside of the resin case 120, and the protruding section 105d provided at the through section 105a is exposed inside the step 121b.

The control terminal 105 is then moved in the direction parallel to the front surface of the lid 121, and the lower end portion of the protruding section 105d contacts the bottom surface of the step 121b, as shown in FIG. 16(c). As a result, the control terminal 105 is prevented by the protruding section 105d and the linking section 105b from moving, and the control terminal 105 is locked to the lid 121.

The following device has been suggested as a modular semiconductor device of an outsert structure in which the control terminal and the resin case are thus separated. The lid is provided with three blocks, and a nut accommodation groove is formed in each of substantially central sections on the upper surface of each block. The blocks are linked together by linking sections, and gaps are formed between the blocks. The gaps are subsequently closed by filling with a sealing resin. A pair of overhang sections is provided on the side surface of the block, and four square holes for inserting and prefixing signal terminals are formed in the overhang sections. A signal terminal is formed in a substantially L-shape from a sheet material, a bulging section is formed somewhat closer to the upper end with respect to the center of the vertical section, and a locking section is formed somewhat closer to the lower end with respect to the center. The bulging section contacts the inner wall of the angular hole and is then forcibly inserted to the position of the locking section, whereby the signal terminal is locked and prevented from falling down (see, for example, Patent Document 1).

The following device of a different configuration has also been suggested. The side surface of a resin case is constituted by a clamping section that extends inward and has an opening in the center, a groove surrounded by the clamping section and provided in the outer wall, and a support base provided below the clamping section and extending inward. An external lead-out terminal is constituted by a cut-out section with a width less than that of the opening of the clamping section, a protruding section protruding toward the side wall side, and a bent section provided below the cut-out section and extending inward. Where the cut-out section of the external lead-out terminal is passed through the opening in the clamping section at the outer wall of the resin case and the external lead-out terminal is lowered, the bent section of the external lead-out terminal is supported by the support base and a catch of the external lead-out terminal is engaged with the groove of the resin case (see, for example, Patent Document 2).

The following device of a different configuration has also been suggested. A locking section for positioning when an external take-out terminal is fixedly attached by soldering is provided at the insulating case itself, and an inclined groove for retaining an adhesive for bonding a heat radiation plate to the insulating case is formed in the lower end surface of the insulating case. An external take-out terminal insertion hole of the insulating case is an angular orifice of a relatively large opening width in part thereof, and the take-out terminal can be tentatively locked by locking the clocking section of the external take-out terminal with a step formed in the section communicating with a small-diameter angular office. Where the external take-out terminal is inserted from the lower angular orifice side and then further inserted against the elastic force acting to induce the outward expansion at the position of the locking section, the locking section expands inside the wide angular orifice while passing through the angular orifice and is restricted and tentatively locked by the step and the inner wall of the wide angular orifice (see, for example, Patent Document 3).

Patent Document 1: Japanese Utility Model Application Publication No. H5-15444
Patent Document 2: Japanese Patent Application Publication No. H7-153906
Patent Document 3: Japanese Patent Application Publication No. H10-65098

DISCLOSURE OF THE INVENTION

However, the results of the comprehensive research conducted by the inventors have revealed the occurrence of the following problems. FIG. 11 is an explanatory drawing illustrating the control terminal vicinity of the conventional semiconductor device. FIG. 11 shows the state of the control terminal vicinity 130 of the semiconductor device 100 shown in FIGS. 13 to 15. As shown in FIG. 11, since the width w101 of the through hole 121a in the longitudinal direction needs to have the dimension obtained by adding up the width w111 of the through section 105a and the width w112 (see FIG. 16(b)) of the protruding section 105d, it is greater than the width w111 of the through section 105a by the width w112 of the protruding section 105d.

Therefore, in a state in which the protruding section 105d contacts the step 121b, a gap w113 is formed between the through section 105a and the side section of the through hole 121a facing the side section where the step 121b is provided. As a result of the formation of such a gap w113, for example, when a compressive load is applied to the through section 105a from an oblique downward direction 131 toward the side surface of the through section 105a where the protruding section 105d is provided (for example, the direction shown by an empty arrow facing down and to the left), the control terminal 105 is displaced and the protruding section 105d is separated from the step 121b.

Where the protruding section 105d separates from the step 121b, the control terminal 105 can be embedded in the resin case 120. The resultant problem is that a compressive load is applied through the control terminal 105 to the circuit pattern 102b joined to the control terminal 105, the wiring substrate 102 can be cracked, and the circuit patterns 102a, 102b of the wiring substrate 102 can be damaged.

Further, where the protruding section 105d is separated from the step 121b, the compressive load applied to the control terminal 105 cannot be received by the protruding section 105d and the resin case 120. The resultant inconvenience is that where the control terminal 105 is long, the control terminal 105 is easily deformed. Where the control terminal 105 is deformed, the dimensional accuracy of the control terminal 105 is decreased and the joining positions of the control terminal 105 or the lid 121 can be displaced. The dimensional accuracy of the position of the control terminal 105 can be also degraded by the formation of the gap w113.

The inventors have also confirmed that the following problems are associated with the semiconductor devices described in Patent Documents 1 to 3. FIGS. 12(a), 12(b) are explanatory drawings illustrating another example of the control terminal vicinity in the conventional semiconductor device. In the control terminal 145 shown in FIGS. 12(a), 12(b), a through section 145a, a linking section 145b, and a connection section 145c are linked together in the same manner as in the control terminal 105 shown in FIGS. 13 to 15. FIG. 12(a) is a plan view taken from the flat surface side of the through section 145a. FIG. 12(b) is a plan view taken from the end portion side of the through section 145a. In the control terminal 145, part of the flat surface of the through section 145a is cut out and an upper end 145d-1 connected to the through section 145a is bent, thereby providing an overhang section 145d projecting outward from the flat surface of the through section 145a.

Such an overhang section 145d is formed by cutting processing in which the operation of cutting out a portion that will serve as the overhang section 145d from the through section 145a and the operation of bending the cut-out overhang section 145d are performed simultaneously when the control terminal 145 is shaped from a single metal sheet by pressing. Where the overhang section 145d is cut out, an orifice 145d-3 of the shape substantially equal to that of the overhang section 145d is formed in the through section 145a.

However, burrs appear in the overhang section 145d formed in the above-described manner, for example, in a lower end portion 145d-2 of the overhang section 145d. As a result, even when a pressure is applied from the direction (direction shown by an empty rightward arrow) 140 so as to return the overhang section 145d to the orifice 145d-3, the overhang section 145d is not completely accommodated in the orifice 145d-3. Therefore, a thickness t110 of the control terminal 145 is a sum total of a thickness t101 of the through section 145a and a thickness t102 through which the protruding section 145d projects from the flat surface of the through section 145a, and the width of the through hole in the lateral direction needs to be larger than the thickness t101 of the through section 145a. As a result, a gap (not shown in the figure) is formed between the through section 145a and the side section of the through hole, and a problem similar to that of the semiconductor device 100 is encountered.

It is an objective of the present invention to provide a semiconductor device of a high mechanical strength and a method for manufacturing a semiconductor device in order to resolve the above-described problems inherent to the related art. It is another objective of the present invention to provide a semiconductor device of high dimensional accuracy and a method for manufacturing a semiconductor device in order to resolve the above-described problems inherent to the related art.

In order to resolve the above-described problems and attain the objectives of the present invention, the present invention provides a semiconductor device having the following features. Thus, the semiconductor device in accordance with the present invention includes: an insulating substrate to which a semiconductor chip is joined; a case that covers a surface of the insulating substrate to which the semiconductor chip is joined; and a control terminal in which one end portion is electrically connected to the semiconductor chip and the other end portion passes through the case and is exposed to the outside of the case, wherein a portion of the control terminal that is exposed to the outside of the case has formed therein a cut-out section obtained by cutting out part of the exposed portion, and a blocking section that is formed by bending a portion surrounded by the cut-out section and remaining on the control terminal, contacts the case from the outer side of the case, and blocks a movement of the control terminal.

In the above-described semiconductor device in accordance with the present invention, the blocking section is configured to be accommodated inside the cut-out section when a pressure is applied in a direction of pressing the blocking section against the cut-out section side.

In the above-described semiconductor device in accordance with the present invention, the blocking section is configured to be accommodated inside the cut-out section by elasticity of a material constituting the blocking section when a pressure is applied in a direction of pressing the blocking section against the cut-out section side.

In the above-described semiconductor device in accordance with the present invention, the control terminal includes: a through section in which one end portion is exposed to the outside of the case and a portion exposed to the outside of the case is provided with the blocking section; and a linking section that is linked to the other end portion of the through section and has a flat surface that is orthogonal to the through section and parallel to the insulating substrate.

In the above-described semiconductor device in accordance with the present invention, the case includes: a lid disposed above the surface of the insulating substrate to which the semiconductor chip is joined; a through hole which is provided in the lid and through which the control terminal passes; a step provided at a side section of the through hole from a surface side of the lid that is exposed to the outside of the case, the step being in contact with the blocking section; and a protrusion that is provided on a surface of the lid on the insulating substrate side and is in contact with the flat surface of the linking section.

In the above-described semiconductor device in accordance with the present invention, an opening width of the through hole has a dimension substantially equal to a width of a side surface of the control terminal passing through the through hole, this side surface facing a side section of the through hole.

The above-described semiconductor device in accordance with the present invention has a structure in which the control terminal and the case are provided as individual parts, and are configured to be assembled by inserting the control terminal into the case.

In order to resolve the above-described problems and attain the objectives of the present invention, the present invention also provides a method for manufacturing a semiconductor device in which a semiconductor chip and a control terminal are fixed onto a metal base, the method having the following features. Thus, the manufacturing method in accordance with the present invention includes a step of covering, with a case, a surface of the metal base where the semiconductor chip and the control terminal are fixed, causing the control terminal to pass through the case, and exposing, to the outside of the case, a blocking section formed by bending a portion that is surrounded by a cut-out section obtained by cutting out a portion of the control terminal and that remains on the control terminal. Performed thereafter is a step of bringing the blocking section into contact with the case from the outside of the case and locking the control terminal to the case.

In the above-described method for manufacturing a semiconductor device in accordance with the present invention, the case is provided with a through hole through which the control terminal passes; and an opening width of the through hole has a dimension substantially equal to a width of a side surface of the control terminal passing through the through hole, this side surface facing a side section of the through hole.

In accordance with the present invention, as described hereinabove, when the control terminal is inserted into the through hole provided in the lid of the case, the blocking section provided at the control terminal is accommodated inside the cut-out section by elasticity of the material constituting the blocking section. Therefore, the thickness of the control terminal when it passes through the through hole can be made equal to the thickness thereof in the case where the blocking section is not provided. As a result, the opening width of the through hole can be made a dimension corresponding to the width and thickness of the control element. Therefore, when the free end of the blocking section comes into contact with the front surface of the lid of the case and the control terminal is locked to the case, the gap appearing between the control terminal and the side section of the through hole can be made less than that in the conventional configuration. As a consequence, the free end of the blocking section is not separated from the front surface of the lid of the case after the control terminal has been locked to the case.

Further, in accordance with the present invention, as described hereinabove, after the control terminal passes through, the through hole provided in the lid of the case, the blocking section provided at the control terminal is returned (springback) by the elasticity of the material constituting the blocking section to a state in which the blocking section overhangs from the flat surface of the control terminal. As a result, the free end of the blocking section comes into contact with the front surface of the lid, and the control terminal is locked to the case. Therefore, even when a compressive load is applied to the control terminal locked by the blocking section to the case, the blocking section is not separated from the front surface of the lid of the case.

Since the free end of the blocking section is not separated from the front surface of the lid of the case after the control terminal is locked to the case, the control terminal can be prevented from being embedded in the case. Therefore, it is possible to prevent the wiring substrate from cracking and the circuit pattern of the wiring substrate from breaking under the effect of the compressive load applied to the wiring substrate and circuit pattern via the control terminal.

Further, in accordance with the present invention, as described hereinabove, since the blocking section is not separated from the step provided on the front surface of the lid of the case, the compressive load is applied to the blocking section and the case via the control terminal, and the compressive load applied to the control terminal can be reduced. Therefore, the deformation of the control terminal can be reduced. Further, in accordance with the present invention, as described hereinabove, the opening width of the through hole can be made a dimension corresponding to the width and thickness of the through section. Therefore, the movability range of the control terminal, for example, when an obliquely downward pressure is applied to the control terminal in the assembled semiconductor device can be narrowed.

An effect attained with the semiconductor device and the method for manufacturing a semiconductor device in accordance with the present invention is that a semiconductor device of increased mechanical strength can be provided. Another effect attained with the semiconductor device and the method for manufacturing a semiconductor device in accordance with the present invention is that a semiconductor device of high dimensional accuracy can be provided.

BEST MODE FOR CARRYING OUT THE INVENTION

The preferred embodiments of the semiconductor device and the method for manufacturing a semiconductor device in accordance with the present invention will be explained below in greater detail with reference to the appended drawings. In the explanation of the embodiments and the appended drawings, like components will be assigned with like reference symbols and redundant explanation thereof will be omitted.

Embodiments

Figure 1:
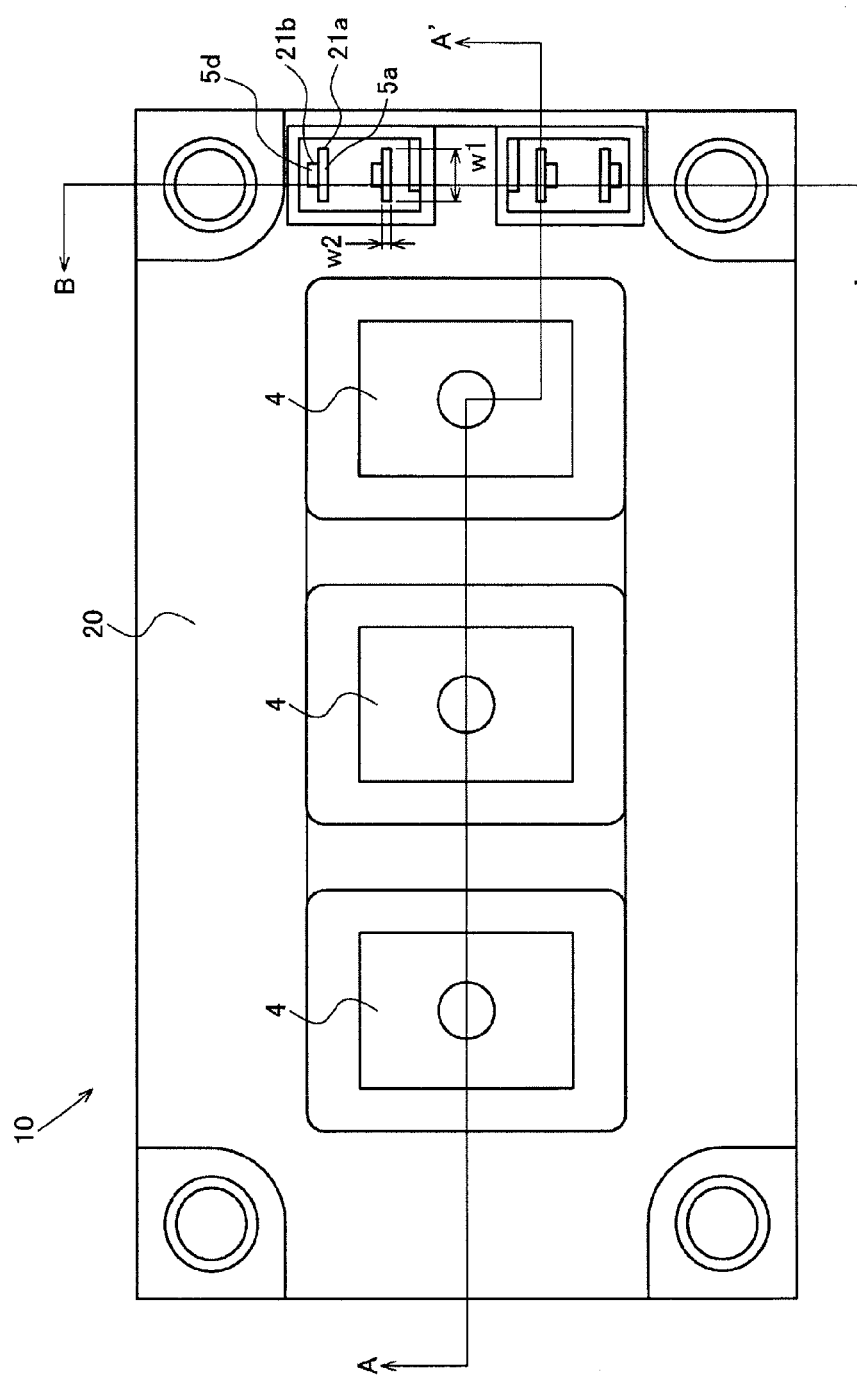
FIG. 1 is a plan view illustrating a modular semiconductor device of an embodiment.
Figure 2:
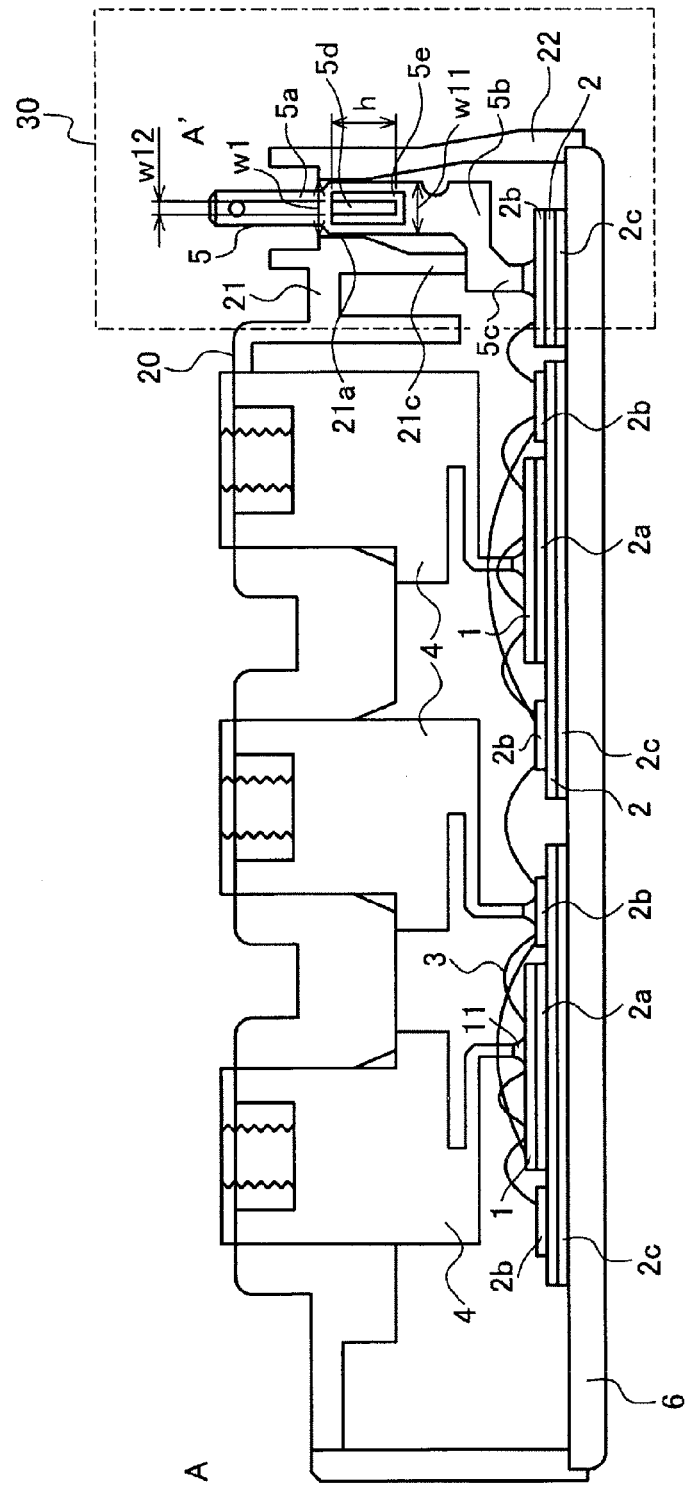
FIG. 2 is a cross-sectional view taken along a line A-A' in FIG. 1.
Figure 3:
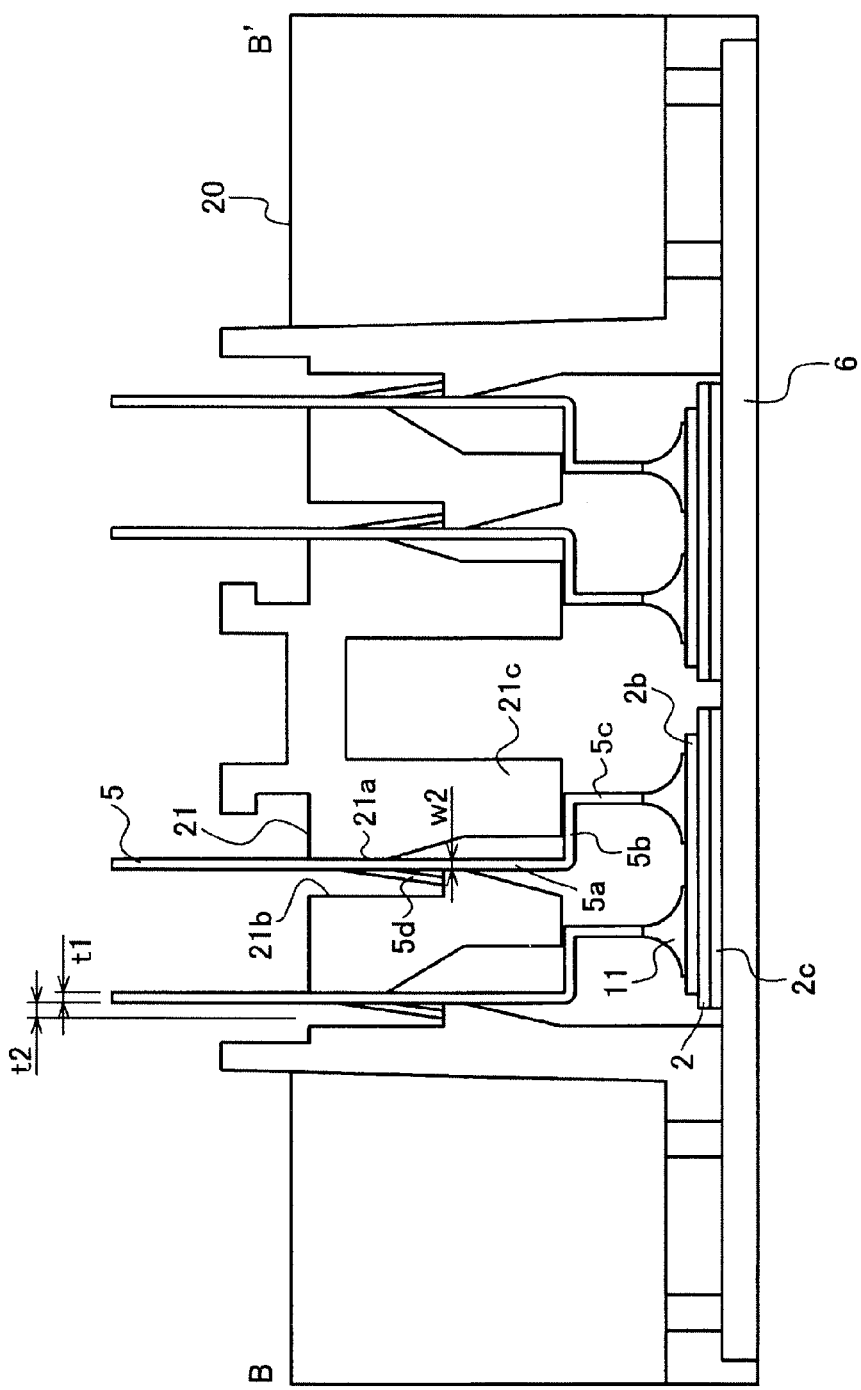
FIG. 3 is a cross-sectional view taken along a line B-B' in FIG. 1.

FIG. 1 is a plan view illustrating a modular semiconductor device of an embodiment. FIG. 2 is a cross-sectional view taken along a line A-A' in FIG. 1. FIG. 3 is a cross-sectional view taken along a line B-B' in FIG. 1. As shown in FIGS. 1 to 3, a semiconductor device 10 according to the embodiment is provided with a semiconductor chip 1, a wiring substrate 2, a wire wiring 3, main terminals 4, a control terminal 5, a metal base 6, and a resin case 20. The resin case 20 is obtained by integrally molding a lid 21 and a side wall 22.

In the wiring substrate 2, circuit patterns 2a, 2b are formed on the surface of an insulating substrate. The rear surface of the semiconductor chip 1 is joined by a joining material (not shown in the figure) to the circuit pattern 2a of the wiring substrate 2. A plurality of semiconductor chips 1, for example IGBT or FWD, is joined to the circuit pattern 2a. An electrode (not shown in the figure; referred to hereinbelow as "front surface electrode") provided on the front surface of the semiconductor chip 1 and the front surface electrode of another semiconductor chip 1 are electrically connected by the wire wiring 3. The semiconductor chips 1, for example IGBT or FWD, may be connected reversely in parallel by the circuit patterns 2a and wire wirings 3 to constitute an arm. The wire wiring 3 is, for example, an aluminum wire.

The front surface electrode of the semiconductor chip 1 and the circuit pattern 2b of the wiring substrate 2 are electrically connected by the wire wiring 3. One end of the main terminal 4 and one end of the control terminal 5 are joined by a joining material 11 to the circuit pattern 2b of the wiring substrate 2. The main terminal 4 is an external terminal provided for electrical connection to the wiring substrate 2. The control terminal 5 is an external terminal provided for electrical connection to a device (not shown in the figure).

A metal film 2c is provided on the rear surface of the wiring substrate 2, and this metal film 2c is joined by a joining material (not shown in the figure) to the metal base 6. The metal base 6 is produced from a material with good thermal conductivity and conducts the heat generated by the semiconductor chip 1 and transferred through the wiring substrate 2 to the outside of the semiconductor device 10. The resin case 20 is bonded to the circumferential edge of the metal base 6. The other end of each of the main terminal 4 and the other end of the control terminal 5 are exposed to the outside of the resin case 20 through the lid 21 of the resin case 20.

A through hole 21a through which the control terminal 5 passes is provided in the lid 21. The through hole 21a has a substantially rectangular planar shape having the dimensions corresponding to the width and thickness of the control terminal 5 molded, for example, from a single plate-shaped member. The thickness of the control terminal 5 is the thickness of the plate-shaped member used for molding the control terminal 5. More specifically, the width w1 of the through hole 21a in the longitudinal direction thereof has a dimension somewhat larger than the width w11 of a section (through section) 5a of the control terminal 5 that passes through the lid 21. The width w2 of the through hole 21a in the lateral direction has a dimension somewhat larger than the thickness t1 of the through section 5a. Where the thickness t1 of the through section 5a is, for example, 0.5 mm, the width w2 of the through hole 21a in the lateral direction may be, for example, 0.6 mm.

The dimension somewhat larger than the dimension of the through section 5a, as referred to herein, is a dimension that allows the through section 5a of the control terminal 5 to pass therethrough and also a dimension at which the movability range of the through section 5a, for example, when an obliquely downward pressure is applied to the through section 5a is narrow and the flat surface of the through section 5a can be maintained substantially perpendicular to the wiring substrate 2. The side section in the lateral direction of the through hole 21a is substantially parallel to the arrangement direction of the main terminals 4 fixed to the lid 21.

The side section in the longitudinal direction of the through hole 21a is provided with an L-shaped step 21b on the side of the surface (front surface) of the lid 21 that is exposed to the outside of the resin case 20. The through hole 21a and the step 21b are connected to each other. The step 21b is provided to a depth such as not to pass through the lid 21. The bottom surface of the step 21b may have an inclination such that the angle formed with the side section of the step 21b that is provided substantially perpendicular to the front surface of the lid 21 is an acute angle.

A protrusion 21c that protrudes to the wiring substrate 2 side and is connected to the side section of the through hole 21a that faces the side section where the step 21b is provided is provided on the surface (rear surface) of the lid 21 that is exposed inside the resin case 20. In the assembled semiconductor device 10, the protrusion 21c contacts a portion (referred to hereinbelow as "linking section") 5b of the control terminal 5 that forms a substantially right angle with the through section 5a. Thus, the control terminal 5 is brought into contact or close to, and locked (fixed) to the step 21b and the protrusion 21c provided on the front surface and rear surface, respectively, of the lid 21.

Figures 4A, 4B:
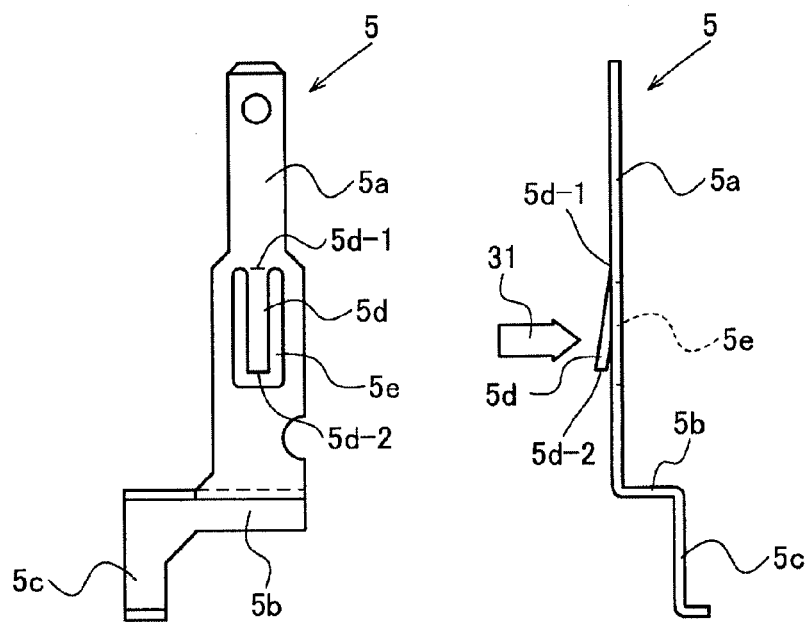
FIGS. 4(a), 4(b) are explanatory drawings illustrating the principal part of the modular semiconductor device according to the embodiment.

The control terminal 5 will be described below in greater detail. FIGS. 4(a), 4(b) are explanatory drawings illustrating the principal part of the modular semiconductor device according to the embodiment. FIGS. 4(a) and 4(b) show the cross-sectional configurations of the control terminal 5 shown in FIGS. 2 and 3, respectively. As shown in FIGS. 4(a), 4(b), the control terminal 5 is constituted by the through section 5a passing through the through hole 21a of the lid 21, a connection section 5c joined to the circuit pattern 2b of the wiring substrate 2 and electrically connected to the wiring substrate 2, and a linking section 5b that links the through section 5a and the connection section 5c. The control terminal 5 is cut out from a flat metal plate as a single part in which the through section 5a, the linking section 5b, and the connection section 5c are successively connected.

The other end (lower end portion) of the connection section 5c that is on the side opposite that of the end portion (upper end portion) linked to the linking section 5b is joined by the joining material 11 to the circuit pattern 2b of the wiring substrate 2. The flat surface of the connection section Sc is substantially perpendicular to the front surface of the wiring substrate 2. The linking section 5b is linked to the connection section 5c at the lid 21 side (upper end portion) of the connection section 5c and forms an L-shape together with the connection section 5c. The flat surface of the linking section 5b is at a substantially right angle to the flat surface of the connection section 5c and is substantially parallel to the front surface of the wiring substrate 2.

Further, the linking section 5b is linked to the end portion (lower end portion) of the through section 5a on the wiring substrate 2 side and forms an L-shape together with the through section 5a. The flat surface of the linking section 5b is at a substantially right angle to the flat surface of the through section 5a. The flat surface of the through section 5a is substantially perpendicular to the front surface of the wiring substrate 2. The end portion (upper end portion) on the opposite side with respect to the lower end portion of the through section 5a is exposed to the outside of the resin case 20 from the through hole 21a provided in the lid 21.

Since the linking section 5b and the through section 5a are thus arranged at a right angle to each other, the linking section 5b is bent (spring effect) by the compressive load applied to the through section 5a. As a result, the compressive load applied to the through section 5a can be absorbed by the linking section 5b; therefore, the damage of the joining material 11 by the compressive load applied to the through section 5a can be reduced. Further, since the linking section 5b is formed by bending and the connecting section 5c has a planar shape, the deformation of the control terminal 5 by the load applied when the control terminal 5 is inserted into the through hole 21a can be reduced.

A blocking section (hook) 5d that blocks the movement of the control terminal 5 is provided on the side surface of the through section 5a that faces the step 21b provided at the side section of the through hole 21a. When the through section 5a is exposed to the outside of the resin case 20, the blocking section 5d is exposed at the step 21b of the resin case 20. The blocking section 5d contacts the bottom surface of the step 21b provided at the side section of the through hole 21a and blocks the movement of the control terminal 5. More specifically, since the compressive load applied to the control terminal 5 from above the control terminal 5 is received by the blocking section 5d, the control terminal 5 is prevented from being pressed against the circuit pattern 2b of the wiring substrate 2.

The blocking portion 5d is formed, for example, by cutting out a square bracket-shaped or U-shaped orifice from the through section 5a to form a strip-shaped portion and bending and jutting out the formed portion about the end portion thereof (referred to hereinbelow as a "base point end") 5d-1, which is connected to the through section 5a, as a base point. The outer shape of the strip-shaped portion matches the contour of the blocking section 5d. More specifically, the blocking section 5d is bent with respect to the base point end 5d-1, which is connected to the through section 5a, as a base point in a manner such that an end portion (referred to hereinbelow as "free end") 5d-2 side that is separated from the through section 5a on the side opposite that of the base point end 5d-1 is at a position separated from the flat surface of the blocking section 5d.

More specifically, the contour of the blocking section 5d is, for example, of a substantially rectangular shape, and the base point end 5d-1, which is one side of the rectangular shape, is connected to the through section 5a. The end portion on the side other than the base point end 5d-1 of the blocking section 5d is separated from the through section 5a. The free end 5d-2, which is a side of the blocking section 5d that faces the base point end 5d-1, projects in the direction opposite to the projection direction of the linking section 5b linked to the through section 5a. Thus, the blocking section 5d and the linking section 5b project in the mutually opposite directions with respect to the through section 5a. Therefore, where a compressive load is applied from the distant end side of the control terminal 5, the control terminal 5 can be prevented from tilting in the thickness direction thereof. When the control terminal 5 passed through the resin case 20, the free end 5d-2 of the blocking section 5d contacts the bottom surface of the step 21b of the resin case 20.

A cut-out section 5e obtained by cutting out part of the portion of the through section 5a exposed to the outside of the resin case 20 is provided around the blocking section 5d of the through section 5a so as to surround the contour of the blocking section 5d. In the cut-out section 5e, a square bracket-shaped (or U-shaped) orifice surrounding the contour of the blocking section 5d, which has been cut out when forming a portion that will be the blocking section 5d in the through section 5a, is connected to the orifice of the same shape as the blocking section 5d, which is formed when the blocking section 5d is formed by jutting out. Thus, the cut-out section 5e is an orifice provided in the through section 5a and having a size such that the side surface of the blocking section 5d, other than the portion connected to the through section 5a, does not contact the side portions of the cut-out section 5e when the blocking section 5d is accommodated in the cut-out section 5e.

The blocking section 5d and the cut-out section Se are formed, for example, in the following manner. First, a square bracket-shaped or U-shaped orifice surrounding the contour of the portion that will be the blocking section 5d is formed, so that the portion that will be the blocking section 5d remains, in the portion of the through section 5a exposed to the outside of the resin case 20. As a result, when the cut-out section 5e is formed in the through section 5a, the portion that will be the blocking section 5d remains in a state in which the base point end 5d-1 is connected to the through section 5a. The portion that will be the blocking section 5d is formed, for example, in a substantially rectangular shape in a state in which the base point end 5d-1 is connected to the through section 5a. The square bracket-shaped or U-shaped orifice formed by cutting out part of the through section 5a becomes the cut-out section 5e after the formation of the blocking section 5d is completed.

Then, the portion that will be the blocking section 5d is bent with respect to the end portion (base point end 5d-1) connected to the through section 5a as a base point, and the end portion (free end 5d-2) facing the end portion connected to the through section 5a is projected (jutted out) from the flat surface of the through section 5a. As a result, the blocking section 5d inclined with respect to the side surface of the through section 5a is formed. As a result of forming the blocking section 5d, the cut-out section 5e is formed that has, for example, a substantially rectangular shape and is larger in size than the contour of the blocking section 5d. The shape of the blocking section 5d and the cut-out section 5e is not limited to the rectangular shape and can be changed variously.

When the thickness t1 of the through section 5a is, for example, 0.5 mm, the distance (referred to hereinbelow as "overhang distance of the blocking section 5d") t2, in the direction parallel to the wiring substrate 2, from the side of the blocking section 5d which is opposite the side connected to the through section 5a to the side surface of the through section 5a may be, for example, from 0.2 mm to 1.5 mm. The overhang distance t2 of the blocking section 5d is determined by the elasticity of the material constituting the through section 5a, that is, the material constituting the control terminal 5.

It is desirable that the material constituting the blocking section 5d have a structure such that the blocking section 5d is not fractured by the compressive load applied to the control terminal 5. The material, constituting the control terminal 5 may be, for example, a copper-containing material or an iron-containing material. The length (referred to hereinbelow as "width of the blocking section 5d") w12 of the side of the blocking section 5d that is connected to the through section 5a may be, for example, from 0.5 mm to 2.0 mm. The length (referred to hereinbelow as "height of the blocking section 5d") h of the side of the blocking section 5d that is not connected to the through section 5a may be, for example, from 2.0 mm to 8.0 mm. The width of the square bracket-shaped or U-shaped orifice may be, for example, from 0.1 mm to 1.5 mm.

As a result of forming the square bracket-shaped or U-shaped orifice by cutting out the through section 5a in the above-described manner, a cut-out section 5e of a substantially rectangular shape is formed that has dimensions larger than those of the shape of the blocking section 5d. Therefore, when the blocking section 5d is accommodated in the cut-out section 5e, even if burrs have appeared on the end portion (free end 5d-2 or the end portion orthogonal to the free end 5d-2) of the blocking section 5d which is other than the base point end 5d-1, this end portion of the blocking section 5d which is other than the base point end 5d-1 does not contact the side sections of the cut-out section 5e. Therefore, when the control terminal 5 is inserted into the through hole 21a provided in the lid 21 of the resin case 20, the blocking section 5d can be accommodated inside the cut-out section 5e by the pressure 31 received from the side section of the through hole 21a, and the overhang distance t2 of the blocking section 5d can be made 0.

Further, the surface of the linking section 5b on the lid 21 side contacts the protrusion 21c provided on the rear surface of the lid 21. The linking section 5b receives a tensile load applied in the direction of separating the control terminal 5 from the wiring substrate 2 and prevents the control terminal 5 from moving in the direction of separating from the wiring substrate 2. Therefore, a force in the direction of rotating about the free end 5d-2 of the blocking section 5d as a fulcrum does not act upon the control terminal 5. Thus, the blocking section 5d and the linking section 5b contact the step 21b and the protrusion 21c, respectively, which are provided on the front surface and rear surface, respectively, of the lid 21, and the control terminal 5 is locked to the lid 21 of the resin case 20.

Figure 5:
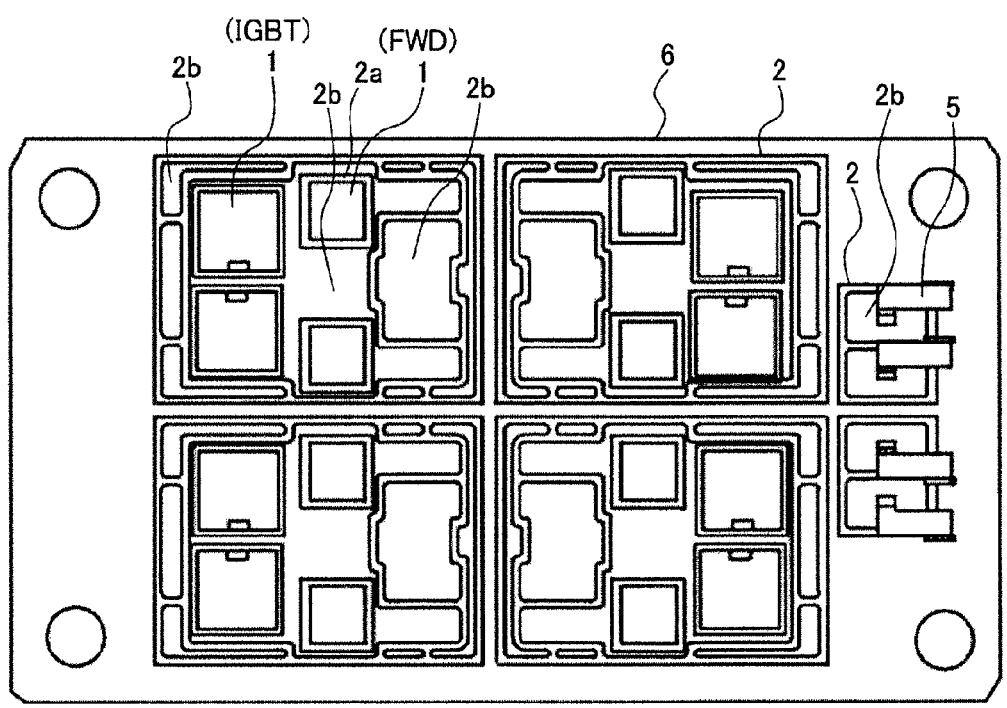
FIG. 5 is a plan view illustrating the semiconductor device according to the embodiment.

FIG. 5 is a plan view illustrating the semiconductor device according to the embodiment. FIG. 5 shows an example of the semiconductor chip 1 joined by a joining material to the circuit pattern 2a of the wiring substrate 2, and the control terminal 5 joined by a joining material to the circuit pattern 2b of the wiring substrate 2. As shown in FIG. 5, a plurality of semiconductor chips 1 is integrated on the circuit pattern 2a of the wiring substrate 2. The semiconductor chip 1 may be, for example, an IGBT (Insulated Gate Bipolar Transistor) chip or a FWD (Free Wheeling Diode) chip. The control terminal 5 having the above-described configuration is joined to each of the circuit patterns 2b of the wiring substrate 2.

Figure 6:
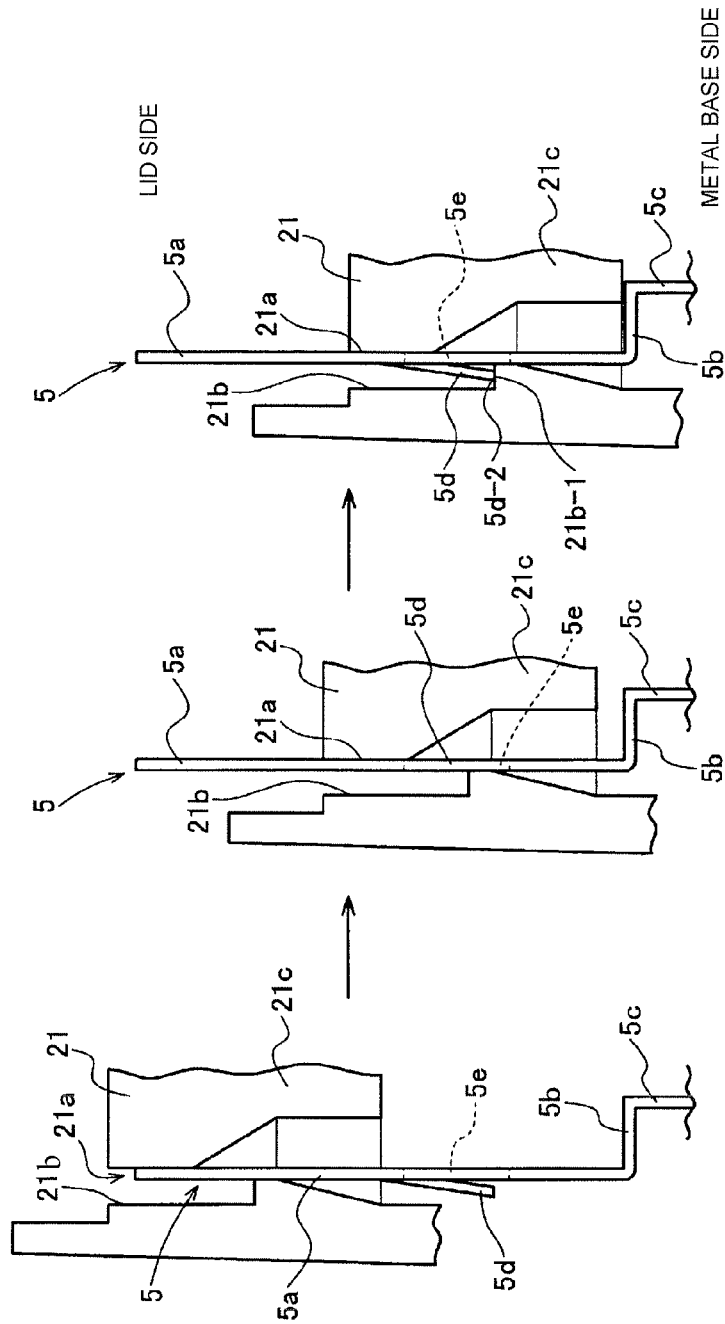
FIGS. 6(a)-6(c) are explanatory drawings illustrating the principal part of the semiconductor device in the assembling process according to the embodiment.

A method for locking the control terminal 5 to the lid 21 will be described below. FIGS. 6(a)-6(c) are explanatory drawings illustrating the principal part of the semiconductor device in the assembling process according to the embodiment. FIGS. 6(a) to 6(c) show the control terminal vicinity 30 of the semiconductor device 10 shown in FIG. 2. FIG. 6(a) shows the control terminal 5 before it is inserted into the through hole 21a. FIG. 6(b) shows the control terminal 5 inserted in the through hole 21a. FIG. 6(c) shows the control terminal 5 locked to the lid 21.

In the semiconductor device 10 that is being manufactured, as shown in FIGS. 6(a) to 6(c), treatment is performed to bond the resin case 20 to the metal base (not shown in the figure). The connection section 5c of the control terminal 5 is joined to the circuit pattern 2b of the wiring substrate 2 (this joint is not shown in FIGS. 6(a) to 6(c)). First, as shown in FIG. 6(a), the through section 5a of the control terminal 5 is inserted from the rear surface side of the lid 21 into the through hole 21a.

Then, as shown in FIG. 6(b), the through section 5a is further inserted into the through hole 21a. The width w2 of the through hole 21a in the lateral direction has a dimension corresponding to the thickness t1 of the through section 5a. Therefore, when the through section 5a passes through the through hole 21a, the free end 5d-2 of the blocking section 5d provided in the through section 5a is pressed by the side section of the through hole 21a against the cut-out section 5e side and accommodated inside the cut-out section 5e by the elasticity of the materials constituting the through section 5a and the blocking section 5d (springback).

Therefore, although the width w2 of the through hole 21a in the lateral direction has a dimension corresponding to the thickness t1 of the through section 5a, a portion of the through section 5a where the blocking section 5d is provided can pass through the through hole 21a. The through section 5a is then inserted into the through hole 21a till the surface of the linking section 5b linked to the lower end portion of the through section 5a, this surface being on the lid 21 side, comes into contact with the protrusion 21c provided on the rear surface of the lid 21.

When the surface of the linking section 5b on the lid 21 side contacts the protrusion 21c, the free end 5d-2 of the blocking section 5d is exposed inside the step 21b, and the free end 5d-2 of the blocking section 5d does not receive the pressure. Since the pressure applied to the free end 5d-2 of the blocking section 5d is zeroed, the blocking section 5d is again returned to the state of overhanging from the flat surface of the through section 5a by the elasticity (springback) of the material constituting the blocking section 5d. As a result, as shown in FIG. 6(c), the lower end portion of the blocking section 5d comes into contact with a bottom section 21b-1 of the step 21b and the control terminal 5 is locked to the lid 21.

Figure 7:
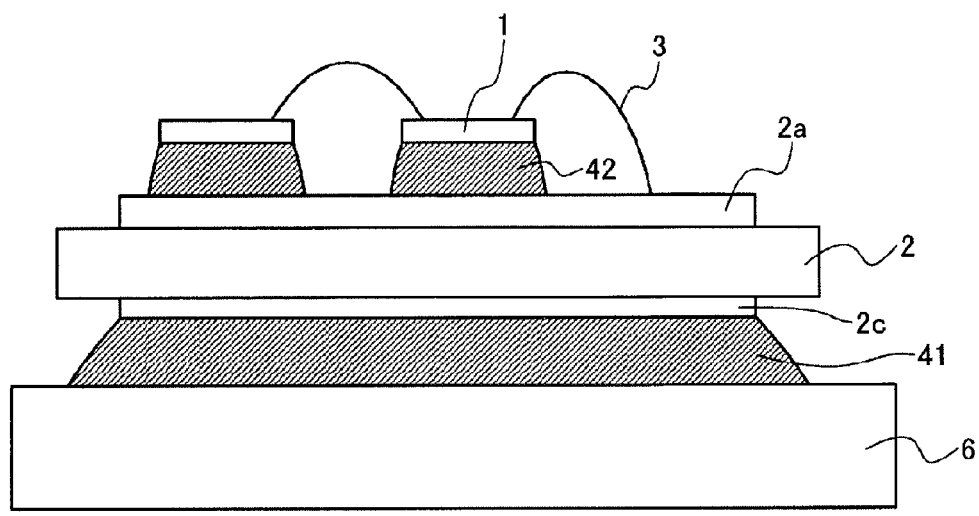
FIG. 7 is an explanatory drawing illustrating the semiconductor device in the assembling process according to the embodiment.
Figure 8:
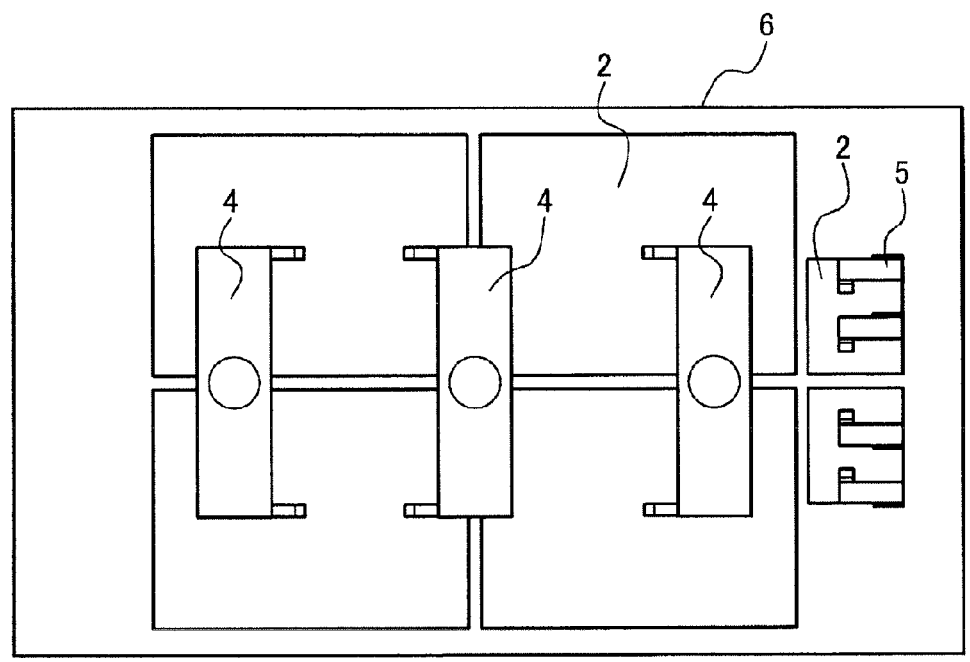
FIG. 8 is an explanatory drawing illustrating the semiconductor device in the assembling process according to the embodiment.
Figure 9:
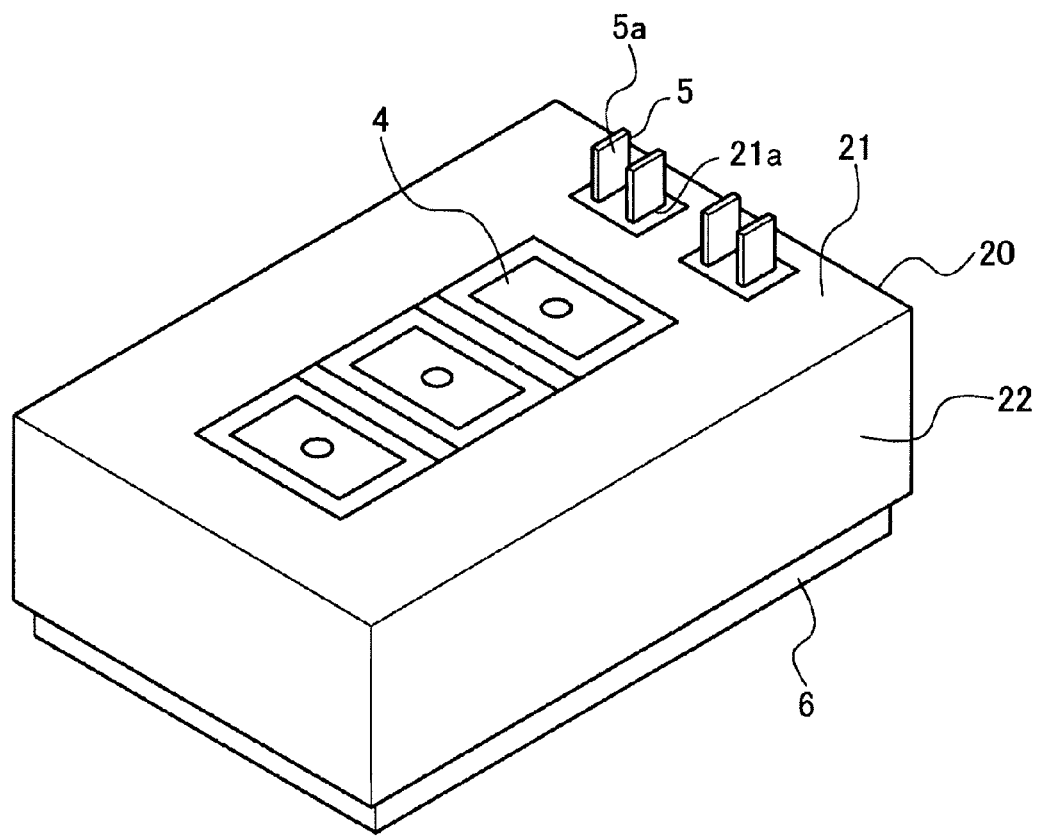
FIG. 9 is an explanatory drawing illustrating the semiconductor device in the assembling process according to the embodiment.

A method for manufacturing the semiconductor device 10 will be explained below. FIGS. 7 to 9 are explanatory drawings illustrating the semiconductor device in the assembling process according to the embodiment. The semiconductor device 10 is a modular semiconductor device of an outsert structure in which the control terminal 5 and the resin case 20 are separated from each other. Thus, the control terminal 5 and the resin case 20 are separate independent components. First, as shown in FIG. 7, the metal film 2c of the wiring substrate 2 is joined with a solder 41 to the front surface of the metal base 6, and the rear surface of the semiconductor chip 1 is joined by a solder 42 to the circuit pattern 2a of the wiring substrate 2. The semiconductor chip 1 and the circuit pattern (not shown in the figure) of the wiring substrate 2 are electrically connected by the wire wiring 3.

In the configuration shown in FIG. 7, a plurality of wiring substrates 2 is joined, as shown in FIG. 5, to the metal base 6 (this configuration is not shown in the figure), the circuit patterns 2a, 2b are provided on each wiring substrate 2, and each semiconductor chip 1 is joined to the respective circuit pattern 2a. Further, as shown in FIG. 8, the main terminal 4 and the control terminal 5 are joined, for example, by a joining material such as a solder, to the circuit pattern (not shown in the figure) of the wiring substrate 2. Then, as shown in FIG. 9, the resin case 20 is covered from the main terminal 4 side, the through section 5a of the control terminal 5 is inserted from the rear surface side of the lid 21 into the through hole 21a along the side section of the through hole formed in the lid 21 of the resin case 20, and the resin case 20 is bonded to the metal base 6.

In this case, the linking section (not shown in the figure) of the control terminal 5 is supported by the protrusion (not shown in the figure) formed on the rear surface of the lid 21, the lower end portion of the blocking section of the control terminal 5 is engaged with the step at the lid 21, and the control terminal 5 is locked to the resin case 20. Then, an auxiliary resin case (not shown in the figure) is mounted on the resin case 20 and the upper end portion of the main terminal 4 is fixed, thereby completing the manufacture of the semiconductor device 10.

Figure 10:
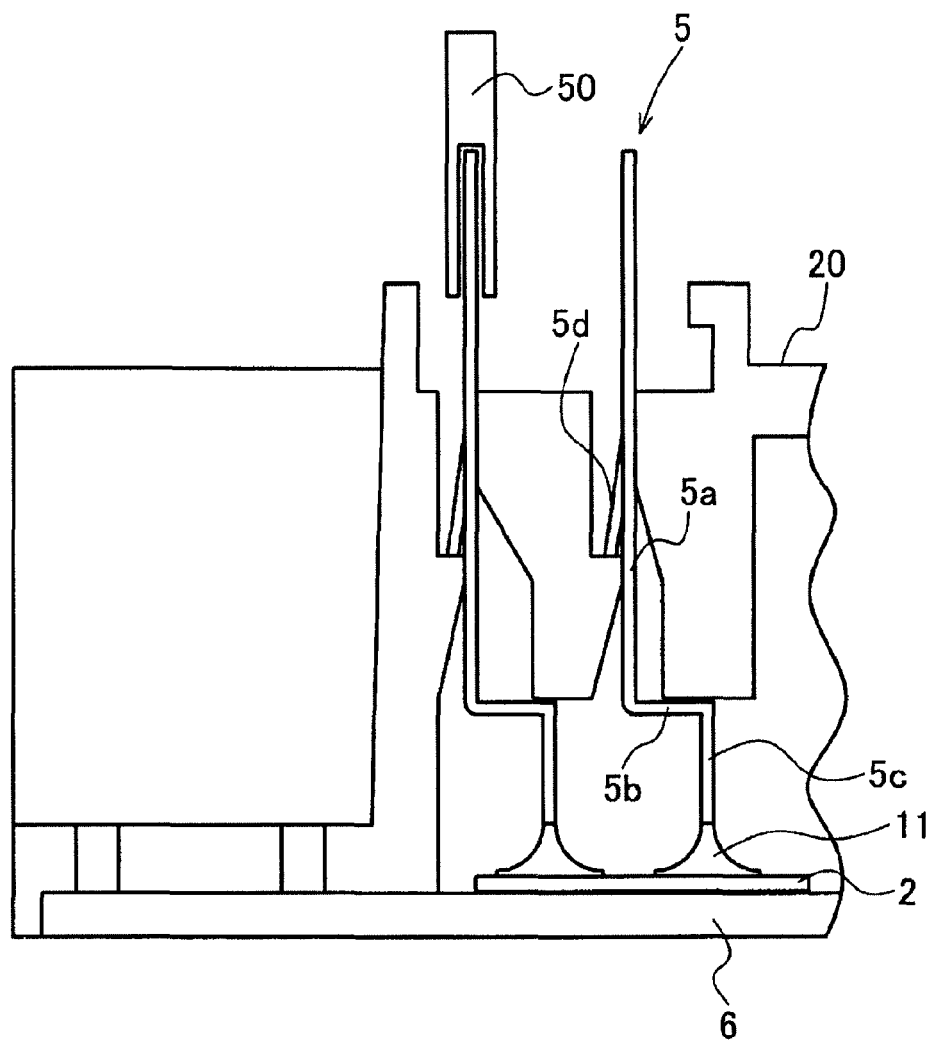
FIG. 10 is a cross-sectional view illustrating an example of the load resistance test of the semiconductor device according to the embodiment.
Figure 11:
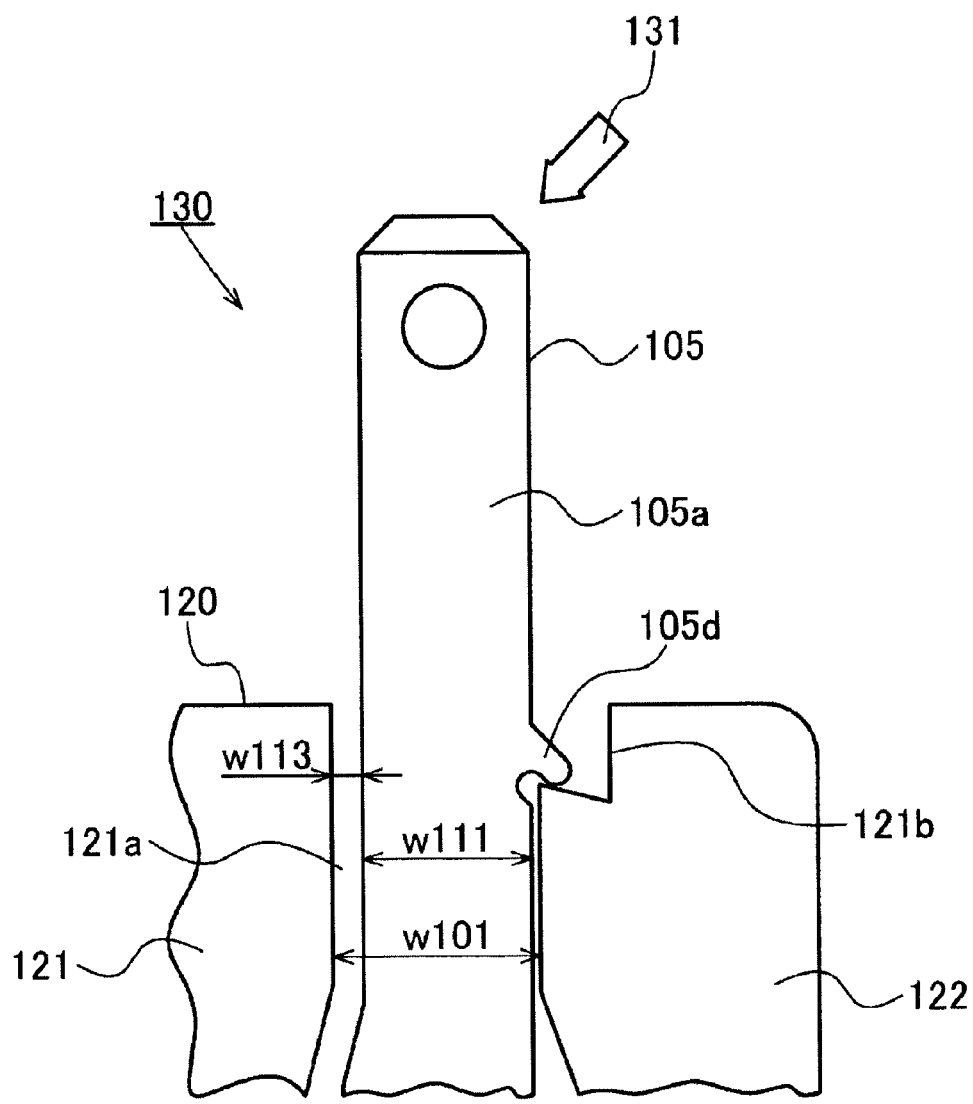
FIG. 11 is an explanatory drawing illustrating the control terminal vicinity in the conventional semiconductor device.
Figure 12A:
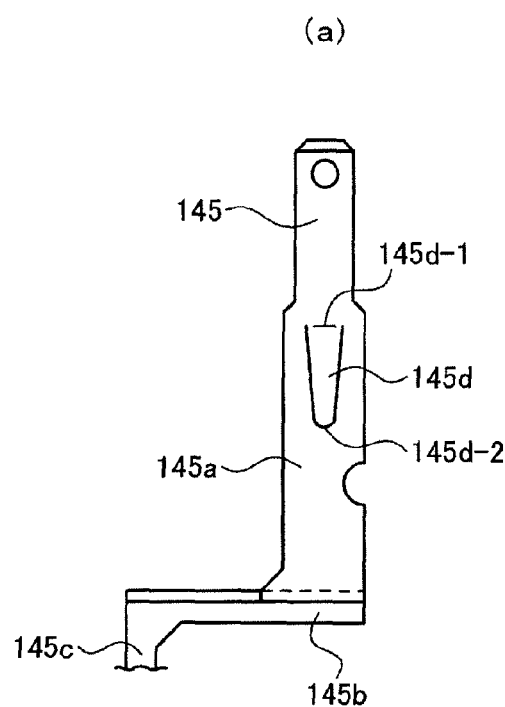
FIGS. 12(a), 12(b) are explanatory drawings illustrating another example of the control terminal vicinity in the conventional semiconductor device.
Figure 12B:
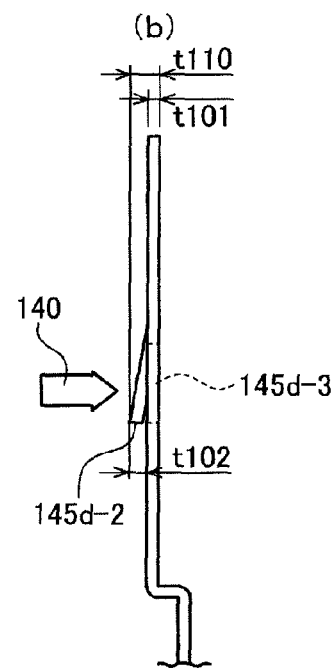
Figure 13:
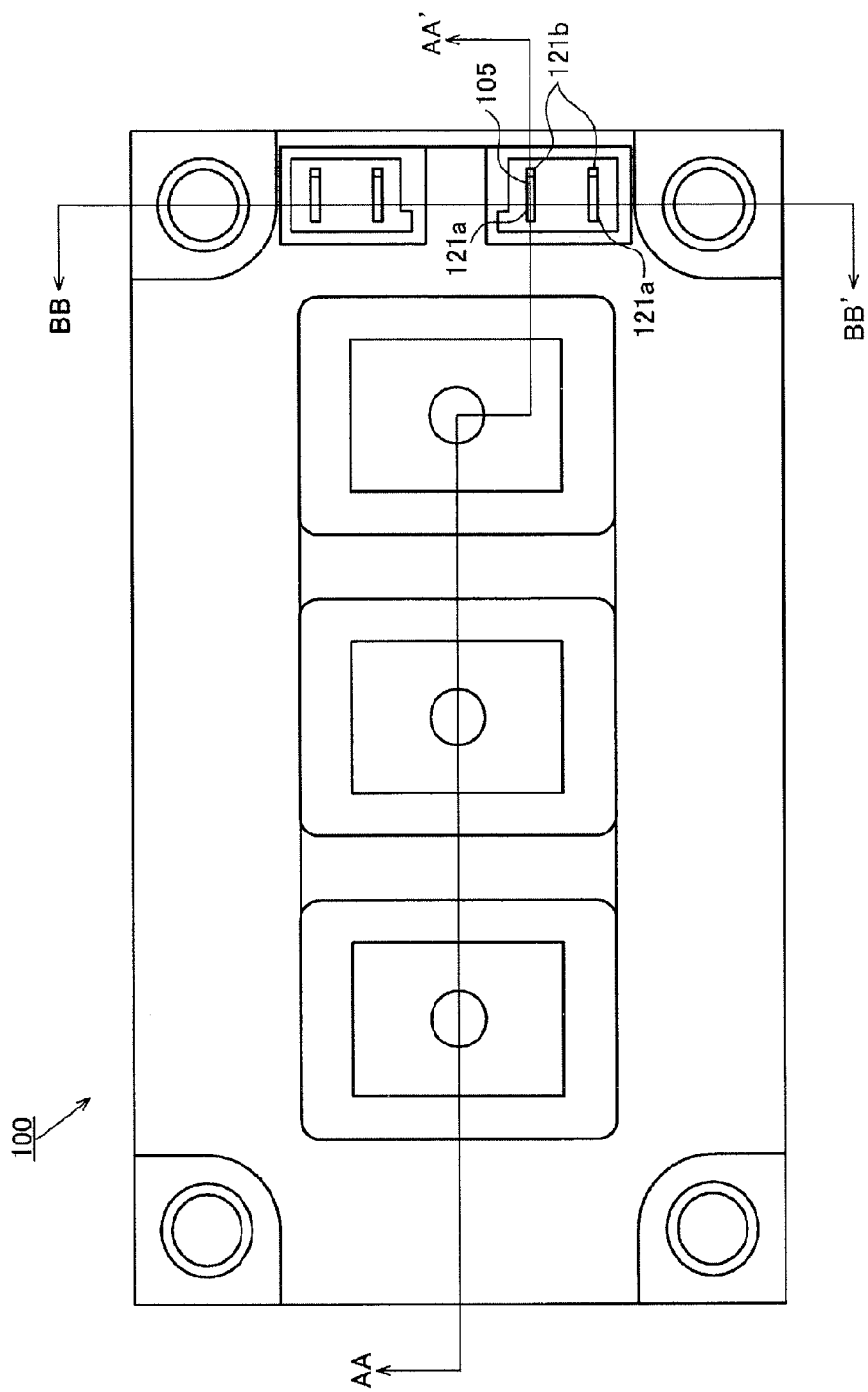
FIG. 13 is a plan view illustrating schematically the conventional modular semiconductor device.
Figure 14:
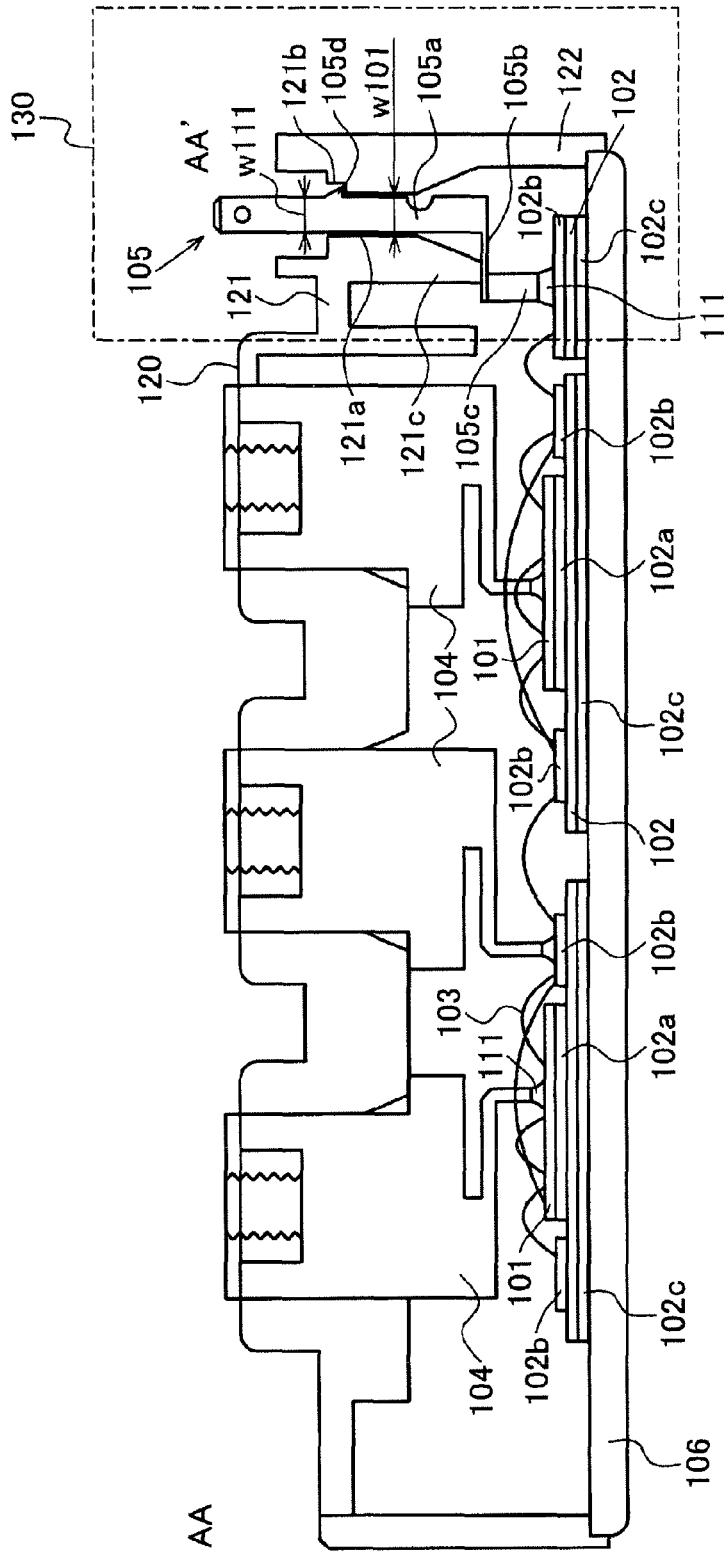
FIG. 14 is a cross-sectional view taken along a line AA-AA' in FIG. 13.
Figure 15:
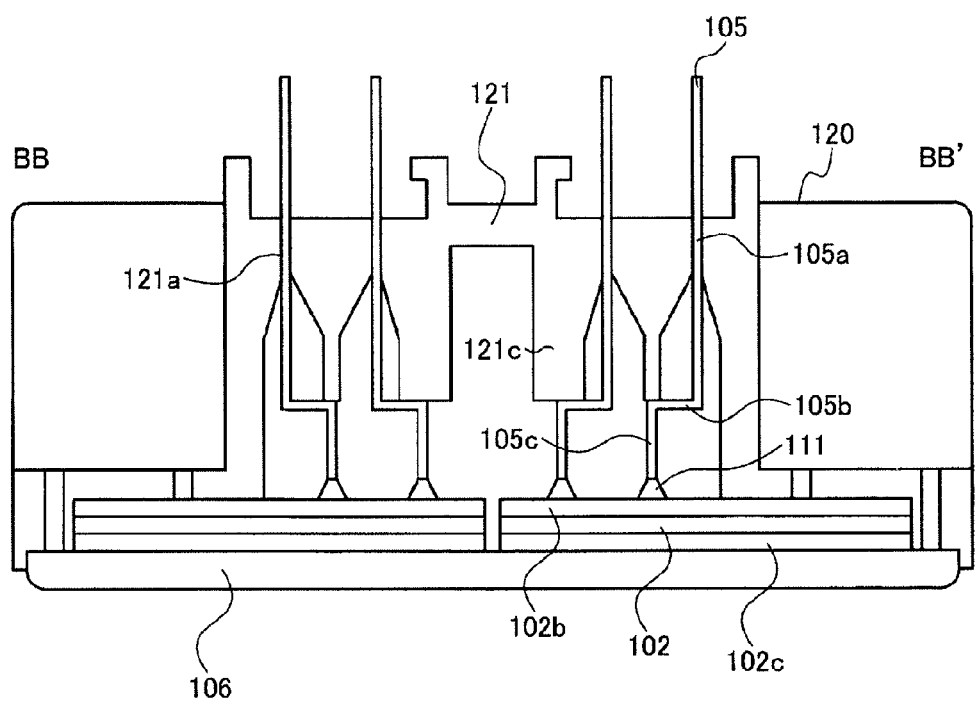
FIG. 15 is a cross-sectional view taken along a line BB-BB' in FIG. 13.
Figures 16A, 16B, 16C:
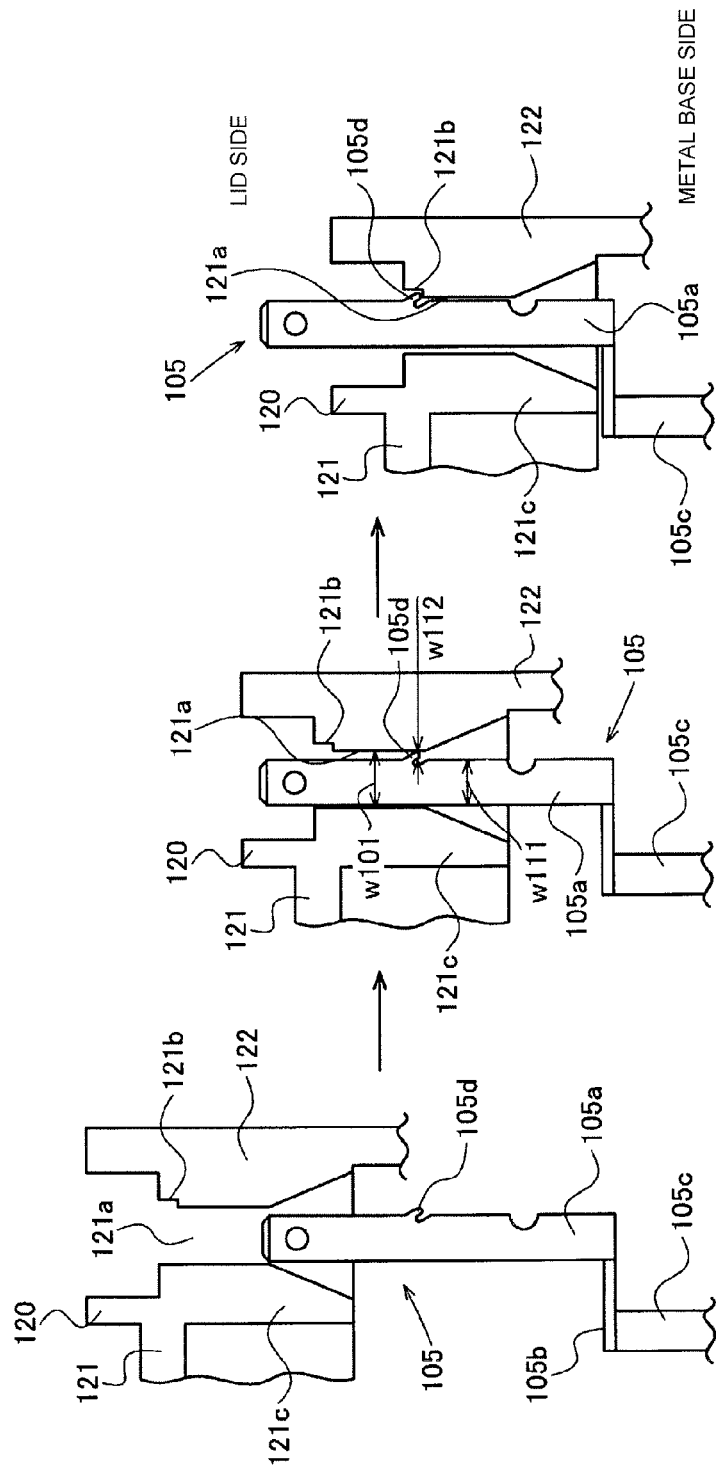
FIGS. 16(a)-16(c) are explanatory drawings illustrating the principal part of the conventional semiconductor device in the assembling process.

FIG. 10 is a cross-sectional view illustrating an example of the load resistance test of the semiconductor device according to the embodiment. The semiconductor device 10 was fabricated according to the embodiment. As shown in FIG. 10, a load jig 50 was mounted on the end portion of the contract terminal 5 that was exposed to the outside of the resin case 20, and the control terminal 5 was fixed so that a compressive load was applied in the direction parallel to the through section 5a of the control terminal 5. A compressive load was then applied by the load jig 50 to the control terminal 5 till the semiconductor device 10 was fractured, and the maximum compressive load of the control terminal 5 was measured.

For comparison, the conventional semiconductor device 100 was fabricated and the maximum compressive load of the semiconductor device 100 was measured by the same method as that used with the semiconductor device 10. The compressive load, as referred to herein, is a load acting in the direction of pushing the control terminal 5 against the wiring substrate 2 side. More specifically, the semiconductor device 10 is considered to be fractured when it cannot be anymore used as a commercial product. More specifically, the semiconductor device 10 is assumed to be fractured when the control terminal 5 is deformed or broken, the blocking section 5d provided at the control terminal 5 is not caught by the step, and the resin case 20 is ruptured.

As a result, it was confirmed that the maximum compressive load of the semiconductor device 10 according to the embodiment is at least twice as high as that of the conventional semiconductor device 100. Thus, the semiconductor device 10 according to the embodiment was confirmed to have a mechanical strength higher than that of the conventional semiconductor device 100.

As explained hereinabove, with the semiconductor device 10 and the method for manufacturing the semiconductor device 10 according to the embodiment, when the control terminal 5 is inserted into the through hole 21a provided in the lid 21 of the resin case 20, the blocking section 5d provided at the through section 5a of the control terminal 5 is completely accommodated inside the cut-out section 5e due to the elasticity of the material constituting the blocking section 5d. Therefore, the thickness t1 of the through section 5a when it passes through the through hole 21a can be made equal to that in the case in which the blocking section 5d is not provided. As a result, the opening width of the through hole 21a can be made a dimension corresponding to the width w11 and thickness t1 of the through section 5a. Therefore, when the free end 5d-2 of the blocking section 5d contacts the bottom section 21b-1 of the step 21b, and the control terminal 5 is locked to the resin case 20, the gap appearing between the control terminal 5 and the side section of the through hole 21a can be made less than that in the conventional configuration. As a result, after the control terminal 5 has been locked to the resin case 20, the free end 5d-2 of the blocking section 5d does not separate from the bottom section 21b-1 of the step 21b.

Further, with the semiconductor device 10 and the method for manufacturing the semiconductor device 10 according to the embodiment, after the through section 5a passes through the through hole 21a, the blocking section 5d is returned (springback) by the elasticity of the material constituting the blocking section 5d to a state in which the blocking section overhangs from the flat surface of the through section 5a. As a result, the free end 5d-2 of the blocking section 5d contacts the bottom section 21b-1 of the step 21b, and the control terminal 5 is locked to the resin case 20. Therefore, even when a compressive load is applied to the control terminal 5 locked by the blocking section 5d to the resin case 20, the free end 5d-2 of the blocking section 5d is not separated from the bottom section 21b-1 of the step 21b.

Since the free end 5d-2 of the blocking section 5d is thus not separated from the bottom section 21b-1 of the step 21b after the control terminal 5 has been locked to the resin case 20, the control terminal 5 can be prevented from being embedded in the resin case 20. Therefore, it is possible to prevent the wiring substrate 2 from cracking and the circuit pattern 2b of the wiring substrate 2 from breaking under the effect of the compressive load applied to the wiring substrate 2 and circuit pattern 2b via the control terminal 5. As a consequence, it is possible to provide the semiconductor device 10 of increased mechanical strength.

Further, with the semiconductor device 10 and the method for manufacturing the semiconductor device 10 according to the embodiment, since the free end 5d-2 of the blocking section is not separated from the bottom section 21b-1 of the step 21b, the compressive load is applied to the blocking section 5d and the resin case 20 via the control terminal 5, and the compressive load applied to the control terminal 5 can be reduced. Therefore, the deformation of the control terminal 5 can be reduced. As a consequence, it is possible to provide the semiconductor device 10 of increased mechanical strength. Further, with the semiconductor device 10 and the method for manufacturing the semiconductor device 10 according to the embodiment, the opening width of the through hole 21a can be made a dimension corresponding to the width w11 and thickness t1 of the through section 5a. Therefore, the movability range of the control terminal 5, for example, when an obliquely downward pressure is applied to the control terminal 5 in the assembled semiconductor device 10, can be narrowed. As a consequence, the semiconductor device 10 of high dimensional accuracy can be provided.

In the present invention described hereinabove, a power module is explained by way of example in which a plurality of semiconductor chips such as IGBT chips and FWD chips is joined by soldering to circuit patterns of an insulating substrate, but the present invention is not limited to the above-described embodiment and can be can applied to packages of modules of various configurations. Further, in the above-described embodiment, a control terminal in which the through section and the linking section form an L-shaped configuration is explained, but such configuration is not limiting, and the control terminal may have any configuration, provided that the control terminal could come into contact with the protrusion provided on the rear surface side of the lid of the case and be locked by the protrusion. More specifically, for example, the through section and the linking section in the control terminal may form a T-shaped configuration, or the through section and the linking section may be linked at an acute angle.

Further, in the above-described embodiment, the blocking section of the control terminal contacts the bottom section of the step provided at the lid of the case, but such configuration is not limited to this, and the control terminal may be locked by the contact of the blocking section of the control terminal with the case. More specifically, for example, a configuration may be used in which the blocking section of the control terminal contacts the flat portion of the front surface of the lid of the case.

INDUSTRIAL APPLICABILITY

As described hereinabove, the semiconductor device and the method for manufacturing a semiconductor device in accordance with the present invention are suitable for semiconductor devices, such as power semiconductor modules, in which a plurality of semiconductor chips is accommodated in the same package.

EXPLANATION OF REFERENCE NUMERALS 1 semiconductor chip
2 wiring substrate
3 wire wiring
4 main terminal
5 control terminal
6 metal base
5a through section of control terminal
5b linking section of control terminal
5c connection section of control terminal
5d blocking section of control terminal
5e cut-out section of control terminal
10 semiconductor device
20 resin case
21 lid of resin case
22 side wall of resin case
21a through hole of resin case
21b step of resin case
21c protrusion of resin case
w1 width of through hole in longitudinal direction
w11 width of through section
w12 width of blocking section
h height of blocking section

What is claimed is:

1. A semiconductor device comprising:
an insulating substrate joined with a semiconductor chip;
a case covering a surface of the insulating substrate where the semiconductor chip is joined, and having a lid disposed above a surface of the insulating substrate where the semiconductor chip is joined; and
a control terminal having one end portion electrically connected to the semiconductor chip, and another end portion passing through the lid and exposed to outside of the case,
wherein the control terminal includes a through section exposed to the outside of the case and extending perpendicular to the insulating substrate, the through section having a cut-out section where a part of the exposed portion is cut out, and a blocking section surrounded by the cut-out section and bent laterally outwardly at one end thereof, the blocking section contacting the lid and blocking a movement of the control terminal;
a connection section extending parallel to the through section, and having one end portion connected to the insulating substrate; and
a linking section connecting the through section and the connection section on a side where the blocking section is not disposed, the linking section having a flat surface orthogonal to the through section to absorb a compressive load applied to the through section, and
wherein the lid includes a through hole, through which the through section passes, the through hole having a width in a lateral direction corresponding to a thickness of the through section;
a step provided at a side section of the through hole and extending from an upper surface of the lid exposed to the outside of the case, the step contacting the blocking section; and
a protrusion provided on a side opposite to the step relative to the through hole and contacting the flat surface of the linking section, the protrusion having a size such that when the protrusion contacts the flat surface of the linking section, a free end of the blocking section is exposed inside the step.

2. The semiconductor device according to claim 1, wherein the control terminal is provided as a separate part from the case, and the control terminal is inserted into the case for assembly.

3. The semiconductor device according to claim 1, wherein the cut-out section is a square bracket-shaped orifice surrounding the blocking section to accommodate the blocking section so that a side surface of the blocking section, other than a portion connected to the through section, does not contact side portions of the cut-out section.

4. The semiconductor device according to claim 1, further comprising another control terminal having a through section with a blocking section, a connection section and a linking section corresponding to those of said control terminal, the control terminal and another control terminal being arranged side by side and oriented in a same direction so that the blocking sections of the control terminal and the another control terminal project in a same direction relative to the respective through sections, and
the lid further includes another through hole, another step and another protrusion, said another step being formed above the protrusion for the control terminal so that the blocking section of the another control terminal is retained by the step formed on the protrusion.

* * * * *

UNITED STATES PATENT AND TRADEMARK OFFICE
CERTIFICATE OF CORRECTION

PATENT NO.       : 9,171,768 B2
APPLICATION NO.  : 14/239042
DATED            : October 27, 2015
INVENTOR(S)      : Yoshikazu Takamiya et al.

It is certified that error appears in the above-identified patent and that said Letters Patent is hereby corrected as shown below:

IN THE SPECIFICATION

Please change column 10, line 56, from "... section Sc is" to --... section 5c is--.

Please change column 12, line 18, from "... section Se are" to --... section 5e are--.

Signed and Sealed this
Second Day of February, 2016

Michelle K. Lee
*Director of the United States Patent and Trademark Office*